Jan. 23, 1962 A. P. COLAIACO 3,018,424

RECTIFIER APPARATUS

Filed May 28, 1959

WITNESSES

Edwin E. Bassler

James F. Young

INVENTOR

August P. Colaiaco

BY

F. E. Browder

ATTORNEY

United States Patent Office 3,018,424

Patented Jan. 23, 1962

3,018,424

RECTIFIER APPARATUS

August P. Colaiaco, Forest Hills, Pa., assignor to Westinghouse Electric Corporation, East Pittsburgh, Pa., a corporation of Pennsylvania Filed May 28, 1959, Ser. No. 816,638
5 Claims. (Cl. 317—234)

This invention relates to semiconductor rectifiers, and relates more particularly to series-connected, semiconductor, power rectifier assemblies.

Semiconductor rectifiers such as silicon diodes of the sealed type disclosed in the copending application of J. L. Boyer and A. P. Colaiaco, filed January 14, 1954 and now Patent No. 2,933,662, are suitable for use as power rectifiers since they are capable of withstanding relatively high reverse voltages, and can carry large currents in the forward direction with high efficiency.

In order to obtain high current ratings for such diodes, it is necessary to provide for adequate cooling so as to prevent excessive temperature increase. Water cooling of such diodes has many advantages over air cooling. More effective cooling and higher resulting ratings are obtained with water cooling. Since air is not required for cooling, the diodes can be sealed against corrosive atmospheres often present in many plants. The large fan needed for air cooling is eliminated so that diode assemblies can be made smaller. The problem of removing heated air from a building is eliminated since the diode heat is carried out through the water system.

In prior water cooled diode assemblies, the diodes were assembled directly to water-cooled, current carrying busses. This has the disadvantage that all of the diodes on one bus are at the same potential so that they can only be electrically connected in parallel. Where the diodes must be connected in series to obtain high voltages, they must be seriesed in groups. Then, when a diode in one group fails, it shorts out all of the diodes connected in parallel with it. Also, since the water-cooled bus is at diode potential, water must be conducted to and from it by insulating hoses. This causes electroylsis of the bus which must be reduced by use of targets or by special treatment of the water to reduce its conductivity.

This invention provides a water-cooled diode assembly in which the diodes on one bus can be connected electrically in series, or can be connected electrically in series with diodes on another bus.

An object of this invention is to water cool, series-connected diodes.

Another object of this invention is to so mount diodes on a water cooled bus that they can be connected electrically in series.

Another object of this invention is to insulatedly support diodes on a water-cooled bus.

Another object of this invention is to insulatedly support series-connected diodes on a water cooled bus.

This invention will now be described with reference to the annexed drawings, of which:

Figure 1:
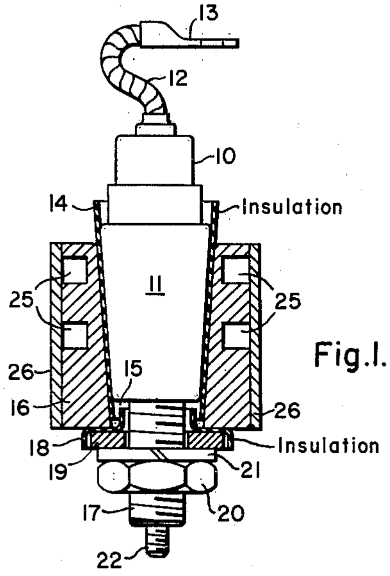
FIG. 1 is a side view in section, of a diode and of a portion of a water-cooled bus on which it is mounted, embodying this invention.

A sealed diode 10 such as is described in said application, is attached to a tapered copper base 11 shaped as a frustum of a cone, with its positive side electrically connected to the base 11. The negative side of the diode 10 is electrically connected to the lower end of a stranded copper cable 12 which has a terminal lug 13 on its upper end. The base 11 has an insulating member 14 of electrical insulation such as mica or fish paper around it, and is wedged in a correspondingly tapered opening 15 in a copper bus 16, with the insulating member 14 spacing the base 11 from the bus 16. The insulation member 14 may be a sheet wrapped around the base 11 or it may be formed separately as a frustum of a cone or tapered cylinder to snugly receive the tapered base 11. The lower end of the base 11 has a threaded portion 17 of reduced diameter extending below the base 11. A collar 18 of electrical insulation extends around the base portion 17 where it extends through the lower portion of the bus 16, and extends between a metal washer 19 which has an outer diameter larger than the diameter of the lower end of the opening 15 in the bus 16, and the bottom of the bus 16. The base 11 is clamped to the bus 16 by the washer 19, and by a lock washer 21 and nut 20 threaded onto the base portion 17. The base portion 17 has a threaded lower portion 22 of reduced diameter which is the positive terminal of the diode 10, and is adapted to receive a terminal lug which is not shown by FIG. 1.

The insulating collar 18 spaces and insulates the washer 19 from the bus 16.

The bus 16 has vertically spaced-apart slots 25 on each side of the diode 10, which are covered by copper plates 26 which are brazed to the bus 16. Water or other cooling fluid is circulated through the slots 25 for absorbing the heat added to the bus by the diode 10 and any other similar diodes on the same bus.

Because of the taper of the base 11 of the diode 10, and of the complemental opening 15 in the bus 16, pulling up the nut 20 on the threaded lower portion 17 of the base 11, exerts great wedging force between the base 11 and the bus 16, ensuring good thermal contact. The insulation member 14 is sufficiently compressible that it can make good area contact with both the diode base 11 and the bus 16, and is thin enough for the thermal drop across it to be of little or no consequence.

Other diodes similar to the diode 10 can be mounted on and similarly insulated from a single bus so that they can be connected in series with each other or with diodes on another bus. With the water-cooled bus insulated from its diodes, it can be grounded so that no insulating, water conducting hoses are necessary. There can be no electrolytic problem so that targets or special treatment of the water used, are unnecessary.

Figure 2:
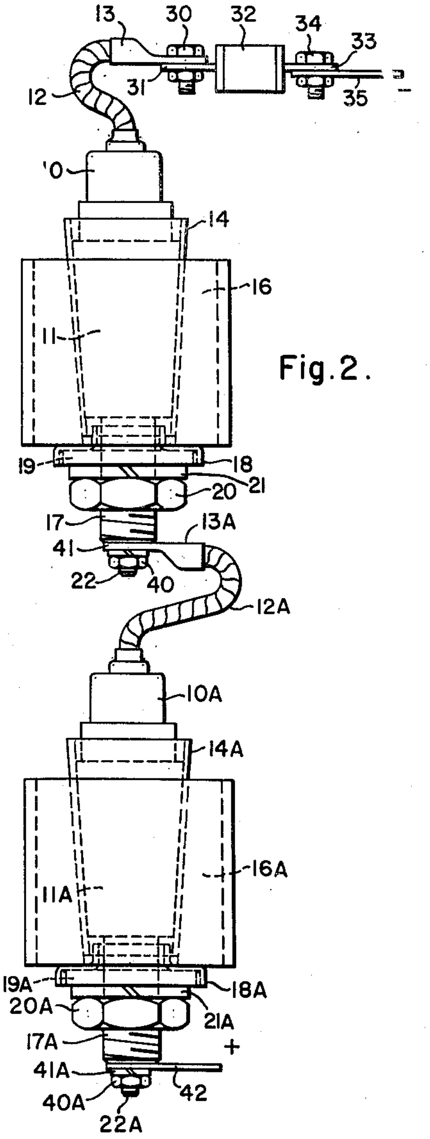
FIG. 2 is a side view of two such diodes on two such water-cooled busses, connected electrically in series.

FIG. 2 shows how individual diodes 10 and 10A on adjacent upper and lower busses 16 and 16A respectively, can be connected in series. The terminal lug 13 of the cable 12 of the upper diode 10 is clamped by a bolt 30 to one terminal 31 of a fuse 32, the other terminal 33 of the fuse being clamped by a bolt 34 to a load conductor 35. The positive terminal 22 of the upper diode 10 has lug 13A of cable 12A of lower diode 10A clamped thereto by a nut 40 and lock washer 41. The lower diode 10A has a tapered base 11A with an extension 17A, and is clamped to the lower bus 16A by a washer 19A, lock washer 21A and nut 20A. An insulating collar 18A insulates the washer 19A from the bus 16A, and an insulating member 14A insulates the tapered base 11A of the lower diode from the lower bus. The positive terminal of the lower diode 10A has a load conduictor 42 clamped thereto by a nut 40A and lock washer 41A. The two diodes 10 and 10A are thus connected in series by the cable 12A.

Figure 3:
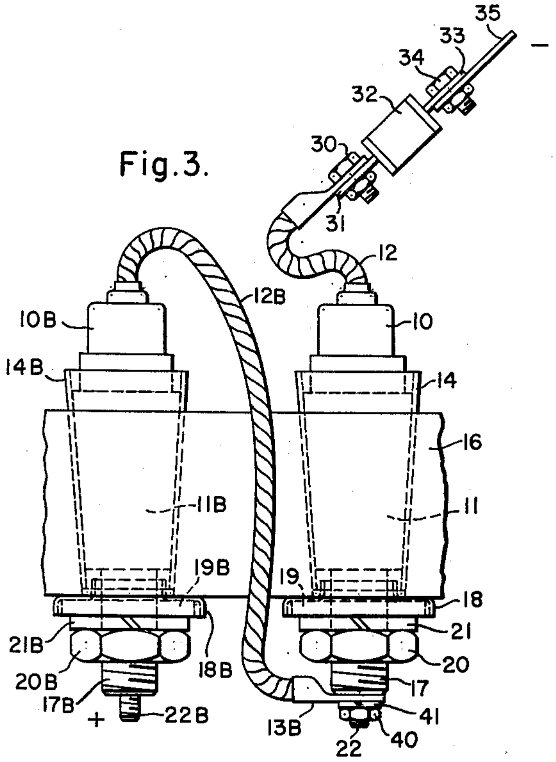
FIG. 3 is a side view of two such diodes on the same water-cooled bus and connected electrically in series.

FIG. 3 shows how two similar diodes 10 and 10B can be mounted on the same bus and connected in series. A stranded cable 12B connected to the negative side of the diode 10B, has its terminal lug 13B clamped to the positive terminal 22 of the diode 10 by lock washer 41 and nut 40, connecting the two diodes in series. The diode 10B has a tapered base 11B with an extension 17B, and is clamped to the bus 16 by a washer 19B, lock washer 21B and a nut 20B. An insulating collar 18B insulates the washer 19B from the bus, and an insulating member 14B insulates the base 11B from the bus. Other similar diodes which are not shown, could be mounted similarly on the bus 16 to the left of the diode 10B, and connected in series with the diodes 10 and 10B.

In a case where a terminal of one polarity is to be grounded, the insulation insulating an end diode from its bus, for example, can be omitted for connecting that diode to the bus which in such case can act as a current carrier.

I claim as my invention:

1. A rectifier assembly comprising a water-cooled, metal bus having a plurality of openings extending therethrough, said openings being spaced apart longitudinally of said bus, a plurality of semiconductor diodes having terminals of one polarity extending beyond one side of said bus, said diodes having terminal bases of the opposite polarity in said openings, said bases having extensions extending from said openings beyond the opposite side of said bus, electrical insulation around said buses and spacing said bases from said bus in said openings, means for clamping said bases to said bus, electrical insulation spacing said means from said bus, and means connecting a terminal of said one polarity of one of said diodes to the terminal base extension of an adjacent one of said diodes.

2. A rectifier assembly comprising a water-cooled, metal bus having an opening extending therethrough, said opening being shaped as a frustum of a cone, a semiconductor diode having a metal terminal base shaped as a frustum of a cone in said opening and having an extension extending from said opening beyond said bus, electrical insulation around said base and spacing said base from said bus in said opening, means around said extension for clamping said base to said bus, and electrical insulation spacing said means from said bus.

3. A rectifier assembly comprising a water-cooled, metal bus having a plurality of openings shaped as frustums of cones extending therethrough, said openings being spaced apart longitudinally of said bus, a plurality of semiconductor diodes having terminal of one polarity extending beyond one side of said bus, said diodes having metal terminal bases of the opposite polarity shaped as frustums of cones in said openings, said bases having extensions extending from said openings beyond the opposite side of said bus, electrical insulation around said bases and spacing said bases from said bus in said openings, means around said extensions clamping said bases to said bus, and electrical insulation spacing said means from said bus.

4. A rectifier assembly comprising a water-cooled, metal bus having a plurality of openings shaped as frustums of cones extending therethrough, said openings being spaced apart longitudinally of said bus, a plurality of semiconductor diodes having terminals of one polarity extending beyond one side of said bus, said diodes having metal terminal bases of the opposite polarity shaped as frustums of cones in said openings, said bases having extensions extending from said openings beyond the opposite side of said bus, electrical insulation around said bases and spacing said bases from said bus in said openings, means around said extensions clamping said bases to said bus, electrical insulation spacing said means from said bus, and means connecting a terminal of said one polarity of one of said diodes to the terminal base extension of an adjacent one of said diodes.

5. A rectifier system comprising a pair of spaced-apart water-cooled, metal busses, each having an opening shaped as a frustum of a cone extending therethrough, a semiconductor diode having a terminal of one polarity extending beyond one side of one of said busses, another semiconductor diode having a terminal of said one polarity extending beyond one side of the other of said busses, said diodes having metal terminal bases of the opposite polarity shaped as frustums of cones in said openings, said bases having extensions extending through said openings beyond the opposite sides of said busses, electrical insulation around said bases and pacing said bases from said busses around said openings, means in said extensions clamping said bases to said busses, electrical insulation spacing said means from said busses, and means connecting said terminal of said one polarity of one of said diodes to said terminal base extension of the other of said diodes.

References Cited in the file of this patent

UNITED STATES PATENTS

| | | |
|---|---|---|
| 2,751,528 | Burton | June 19, 1956 |
| 2,817,048 | Thuermel et al. | Dec. 17, 1957 |
| 2,909,714 | Diebold | Oct. 20, 1959 |
| 2,922,935 | Dolder | Jan. 26, 1960 |